(12) United States Patent
Liu et al.

(10) Patent No.: US 11,393,130 B2
(45) Date of Patent: Jul. 19, 2022

(54) IMAGE COMPRESSION METHOD AND IMAGE COMPRESSOR

(71) Applicant: REALTEK SEMICONDUCTOR CORPORATION, Hsinchu (TW)

(72) Inventors: Kai Liu, Taipei (TW); Wen-Tsung Huang, Chiayi (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 247 days.

(21) Appl. No.: 16/835,996

(22) Filed: Mar. 31, 2020

(65) Prior Publication Data
US 2020/0334864 A1 Oct. 22, 2020

(30) Foreign Application Priority Data
Apr. 18, 2019 (TW) ................. 108113618

(51) Int. Cl.
*G06K 9/36* (2006.01)
*G06T 9/00* (2006.01)
(Continued)

(52) U.S. Cl.
CPC .............. *G06T 9/00* (2013.01); *G06T 3/40* (2013.01); *H03M 7/4031* (2013.01);
(Continued)

(58) Field of Classification Search
CPC ........ H04N 7/50; H04N 7/30; H04N 7/26244; H04N 7/26313; H04N 7/26; H04N 7/26563; H04N 7/26579; H04N 7/26393; H04N 7/2651; H04N 19/176; H04N 19/186; H04N 19/196; H04N 19/132; H04N 19/14; G06K 9/645; G06K 9/6202; G06K 9/03;
(Continued)

(56) References Cited

U.S. PATENT DOCUMENTS 10,560,703 B2  2/2020  Liu et al.
2011/0299595 A1* 12/2011  Raveendran ......... H04N 19/176
                                                    375/240.03

(Continued)

FOREIGN PATENT DOCUMENTS

CN      105264888 A    1/2016
TW      I612800 B      1/2018

OTHER PUBLICATIONS

Taiwan Intellectual Property Office, Office Action letter of the counterpart TW application (appl No. 108113618) dated Feb. 7, 2020. English summary on p. 1.

*Primary Examiner* — Duy M Dang
(74) *Attorney, Agent, or Firm* — WPAT, PC

(57) ABSTRACT

An image compression method and an image compressor are provided. The image compression method compresses the image data based on the fixed-length code (FLC) to generate the compressed data, and includes the following steps: determining whether a characteristic value of the image data meets a condition; encoding only the luminance component of the image data to generate the compressed data when the characteristic value meets the condition; encoding the luminance and chrominance components of the image data to generate the compressed data when the characteristic value does not meet the condition; and storing the compressed data.

19 Claims, 4 Drawing Sheets

(51) Int. Cl.
  *G06T 3/40* (2006.01)
  *H04N 19/196* (2014.01)
  *H03M 7/30* (2006.01)
  *H04N 19/176* (2014.01)
  *H03M 7/40* (2006.01)
  *H04N 19/186* (2014.01)

(52) U.S. Cl.
  CPC ........ *H03M 7/6011* (2013.01); *H04N 19/176* (2014.11); *H04N 19/186* (2014.11); *H04N 19/196* (2014.11)

(58) Field of Classification Search
  CPC . G06K 9/20; G06K 9/32; G06T 9/007; G06T 9/00; G06T 3/40; H03M 7/30; H03M 7/4031; H03M 7/6011; H03M 7/6094
  See application file for complete search history.

(56) References Cited

U.S. PATENT DOCUMENTS

2019/0028737 A1    1/2019  Li et al.
2020/0304812 A1*   9/2020  Budagavi ............... H04N 19/13

* cited by examiner

IMAGE COMPRESSION METHOD AND IMAGE COMPRESSOR

BACKGROUND OF THE INVENTION

1. Field of this Disclosure

The present disclosure generally relates to image compression, and, more particularly, to fixed-length code (FLC)-based adaptive image compression.

2. Description of Related Art

Temporal noise reduction (TNR) achieves noise reduction by low-pass filtering the target image using the previous frame. Compared with the spatial noise reduction (SNR), which usually blurs the image and causes loss of the image details, the temporal noise reduction can keep the image details and texture.

A huge amount of memory is required to store information of previous images, which causes a significant increase in hardware costs. Image compression reduces the amount of data to be stored; thus, hardware costs can be saved. In order to save more hardware costs, it is necessary to increase the compression rate in compressing the information of the previous image. However, image compression methods with great compression rates are likely to cause image distortion, which degrades the effect of temporal noise reduction. Therefore, it is an important issue to keep image distortion as low as possible while saving the hardware or memory costs as much as possible.

SUMMARY OF THE INVENTION

In view of the issues of the prior art, an object of the present disclosure is to provide an image compression method and an image compressor, so as to make an improvement to the prior art.

An image compression method for compressing an image data based on fixed-length code (FLC) to generate a compressed data is provided. The image compression method includes the following steps: determining whether a characteristic value of the image data meets a condition; encoding only a luminance component of the image data to generate the compressed data when the characteristic value meets the condition; encoding the luminance component and a chrominance component of the image data to generate the compressed data when the characteristic value does not meet the condition; and storing the compressed data.

An image compressor for compressing an image data based on fixed-length code (FLC) to generate a compressed data is also provided. The image compressor includes a memory, a determination circuit and a calculation circuit. The memory stores the image data. The determination circuit is configured to determine whether a characteristic value of the image data meets a condition. The calculation circuit is coupled to the memory and the determination circuit and configured to perform the following steps: encoding only a luminance component of the image data to generate the compressed data when the characteristic value meets the condition; and encoding the luminance component and a chrominance component of the image data to generate the compressed data when the characteristic value does not meet the condition.

The image compression method and image compressor of this disclosure can adaptively select a compression (or encoding) mode according to the characteristics of the image. Compared with the traditional technology, the image compression method and image compressor of this disclosure can reduce image distortion and lower hardware costs at the same time.

These and other objectives of this disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an image compression method and an image compressor. On account of that some or all elements of the image compressor could be known, the detail of such elements is omitted provided that such detail has little to do with the features of this disclosure, and that this omission nowhere dissatisfies the specification and enablement requirements. Some or all of the processes of the image compression method may be implemented by software and/or firmware and can be performed by the image compressor or its equivalent. A person having ordinary skill in the art can choose components or steps equivalent to those described in this specification to carry out this disclosure, which means that the scope of this disclosure is not limited to the embodiments in the specification.

Figure 1:
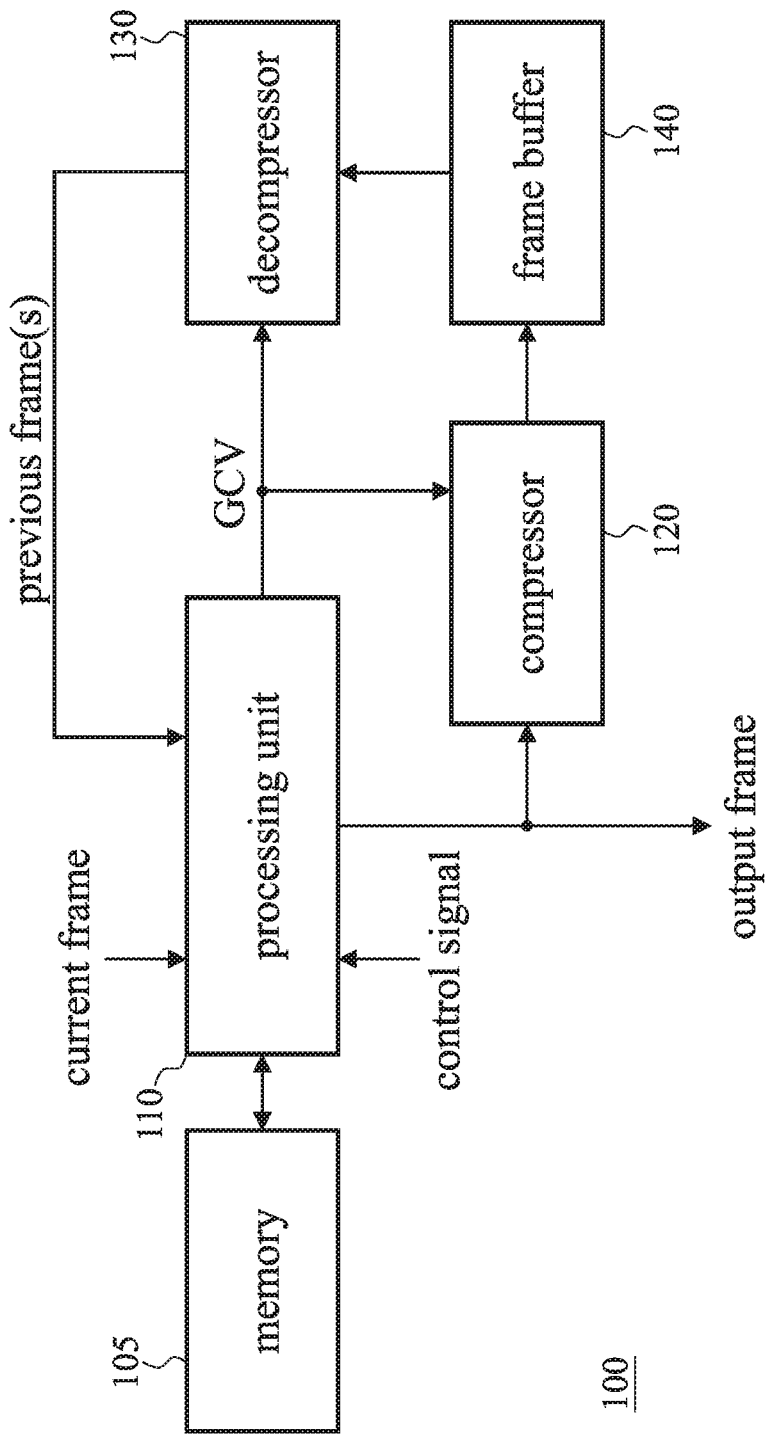
FIG. 1 illustrates a functional block diagram of an image processing device according to an embodiment of this disclosure.

FIG. 1 is a functional block diagram of an image processing device 100 according to an embodiment of this disclosure. The image processing device 100 includes a memory 105, a processing unit 110, a compressor 120, a decompressor 130 and a frame buffer 140. The processing unit 110 performs temporal noise reduction on the current frame by referring to the previous frame(s) to generate an output frame. The output frame is the result generated after temporal noise reduction has been performed on the current frame. The processing unit 110 may be a circuit or an electronic component having a program execution capability, such as a central processing unit (CPU), a microprocessor or a microprocessor unit (MCU). The processing unit 110 performs temporal noise reduction by executing program codes or program instructions stored in the memory 105. Temporal noise reduction is well known to those having ordinary skill in the art, so the details are omitted for brevity.

The compressor 120 compresses the output frame and stores the compressed output frame in the frame buffer 140 to reduce the amount of data to be stored. The decompressor 130 reads the compressed data from the frame buffer 140 and decompresses the compressed data to generate the previous frame(s). The compressor 120 and the decompressor 130 refer to the global characteristic value GCV to perform FLC-based compression and decompression operations, respectively. For details of FLC-based compression and decompression operations, reference can be made to US Patent Publication No. US20180167624A1. The global characteristic value GCV is generated by the processing unit 110 according to the control signal. The control signal, global characteristic value GCV and compressor 120 are discussed in more detail in the following embodiments.

First Embodiment

Figure 2:
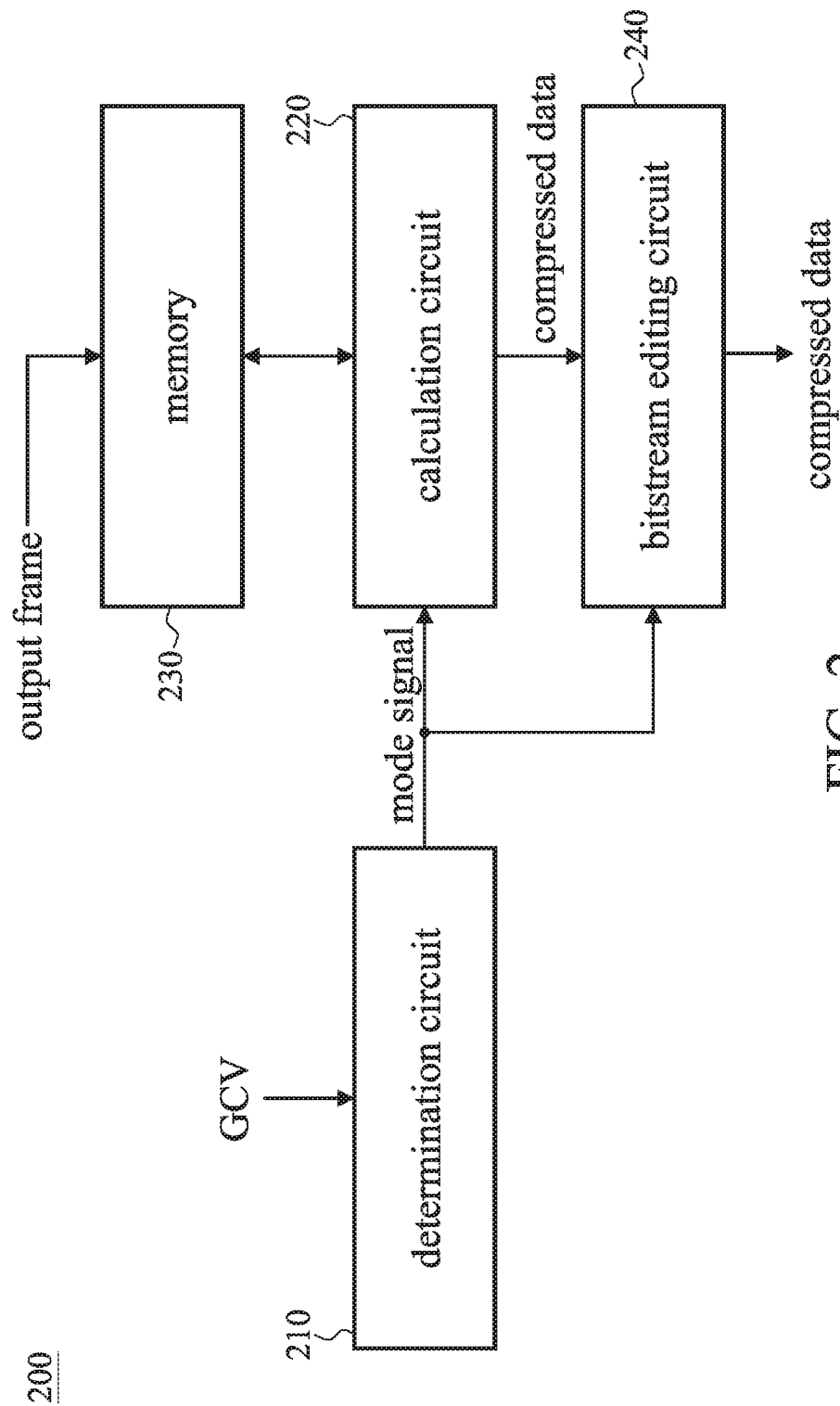
FIG. 2 illustrates a functional block diagram of a compressor according to an embodiment this disclosure.
Figure 3:
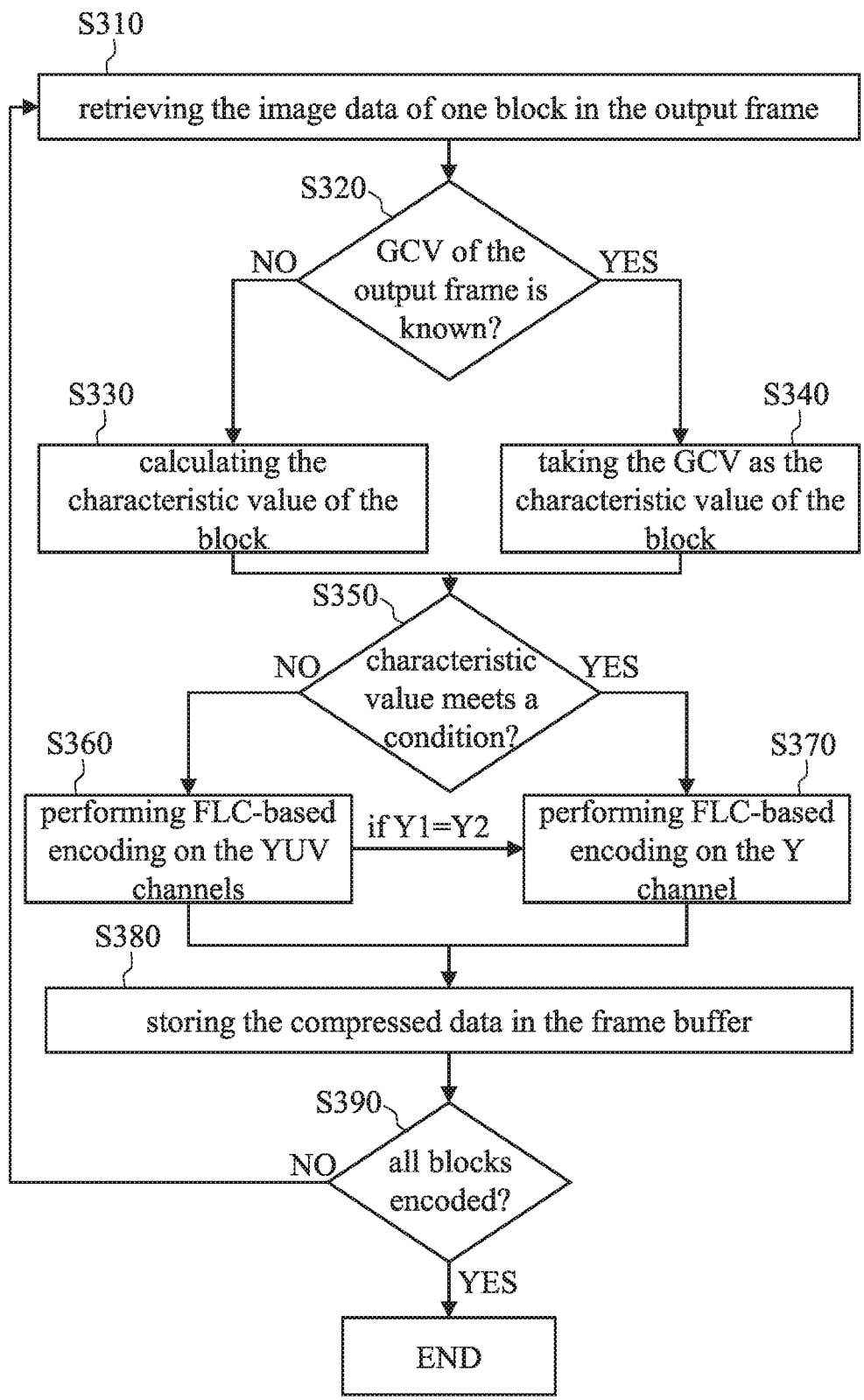
FIG. 3 illustrates a flowchart of an image compression method according to an embodiment of this disclosure.

FIG. 2 is a functional block diagram of the compressor 120 according to an embodiment of this disclosure. FIG. 3 is a flowchart of an image compression method according to an embodiment of this disclosure. The compressor 200 includes a determination circuit 210, a calculation circuit 220, a memory 230 and a bitstream editing circuit 240. The memory 230 may be a line buffer which stores the data of multiple lines of the output frame, and the size of the memory 230 is associated with the size of the block (i.e., window) which the calculation circuit 220 uses in the compression operation. For example, if the block size is N×N pixels, the memory 230 stores the data of N lines at a time. The output frame is divided into multiple non-overlapping blocks in the compression operation. In other words, any pixel in the output frame belongs to only one block. When compression starts, the calculation circuit 220 retrieves the image data of one block from the memory 230 (step S310), and then the determination circuit 210 determines whether the global characteristic value GCV of the output frame is known (step S320). If the global characteristic value GCV has been provided by the processing unit 110 (YES branch of step S320), the determination circuit 210 uses the global characteristic value GCV as the characteristic value of the block (step S340). The case where the processing unit 110 does not provide the global characteristic value GCV (NO branch of step S320) will be discussed in another embodiment.

After the characteristic value of the block is obtained, the determination circuit 210 determines whether the characteristic value of the block meets a condition (step S350). The determination circuit 210 issues a mode signal as an indication of whether the characteristic value meets the condition, and the calculation circuit 220 selects an encoding mode according to the mode signal. In step S360, the calculation circuit 220 encodes the luminance component (i.e., the Y component in the YUV color space) and the chrominance component (i.e., the U and V components in the YUV color space) of the image data to generate the compressed data. In step S370, the calculation circuit 220 encodes only the luminance component of the image data to generate the compressed data and neglects the chrominance component of the image data. The bitstream editing circuit 240 adjusts the data sequence of the compressed data (i.e., the data generated after the YUV-channel FLC-based encoding or the Y-channel FLC-based encoding). The decompressor 130 can correctly determine the encoding mode according to the data sequence of the compressed data when decoding.

The following three scenarios are intended to illustrate the characteristic value and condition by way of examples, rather than to limit the scope of this disclosure. Scenario (1): the characteristic value is the noise level of the image data, and the condition is that the noise level is less than a predetermined value. Scenario (2): the characteristic value is the color saturation of the image data, and the condition is that the color saturation is less than a predetermined value. Scenario (3): the characteristic value is the image property of the image data, and the condition is that the image property is one-channel image (or single-channel image), such as an InfraRed image.

In scenario (1), the processing unit 110 can know the noise level from the control signal, and the control signal may be a gain of a sensor (such as a sensor of a camera module). Because the sensor gain is applied to the entire frame, the characteristic value of each block in the output frame is the same as the global characteristic value GCV of the output frame. A high sensor gain indicates that the current frame corresponds to a light-insufficient scene or environment; thus, the noise level is high. On the contrary, a low sensor gain indicates that the current frame corresponds to a light-sufficient scene or environment; thus, the noise level is low. When the characteristic value does not meet the condition (NO branch of step S350), that is, when the noise level is not less than the predetermined value (equivalent to the sensor gain being not less than a threshold value which is related or equal to the predetermined value), the calculation circuit 220 performs FLC-based encoding on the YUV channels (step S360) since the color noise can be easily perceived. When the characteristic value meets the condition (YES branch of step S350), that is, when the noise level is less than the predetermined value (equivalent to the sensor gain being less than the threshold value which is related or equal to the predetermined value), the calculation circuit 220 performs FLC-based encoding on the Y channel (step S370) since the color noise is not easily perceived, so as to produce less image distortion (in comparison with FLC-based encoding on the YUV channels (step S360)).

In scenario (2), the color saturation can be obtained by the processing unit 110 calculating a color channel average value (e.g., the average value of the color channels) of the entire output frame, and the characteristic value of each block in the output frame is the same as the global characteristic value GCV of the output frame. When the characteristic value does not meet the condition (NO branch of step S350), that is, when the color saturation is not less than a predetermined value, the calculation circuit 220 performs FLC-based encoding on the YUV channels (step S360). When the characteristic value meets the condition (YES branch of step S350), that is, when the color saturation is less than the predetermined value, the calculation circuit 220 performs FLC-based encoding on the Y channel (step S370).

In scenario (3), the processing unit 110 can know the image property from the control signal which is generated by, for example, a sensor module (not shown). The control signal indicates whether the current frame is generated by means of an RGB sensor or a single-channel image sensor (such as an InfraRed sensor). Because the current frame is generated by the same sensor, the characteristic value of each block in the output frame is the same as the global characteristic value GCV of the output frame. When the characteristic value does not meet the condition (NO branch of step S350), that is, when the image property is not a single-channel image, the calculation circuit 220 performs FLC-based encoding on the YUV channels since there is more color information (step S360). When the characteristic value meets the condition (YES branch of step S350), that is, when the image property is a single-channel image, the calculation circuit 220 performs FLC-based encoding on the Y channel since there is less color information (step S370).

After the calculation circuit 220 completes encoding, the bitstream editing circuit 240 adjusts the data sequence of the compressed data before storing the compressed data in the frame buffer 140 (step S380). Next, the calculation circuit 220 determines whether all the blocks in the frame have been encoded (step S390). If step S390 is negative, the flow returns to step S310; if step S390 is positive, the flow ends as the compression of one frame has been completed.

Second Embodiment

Figure 4:
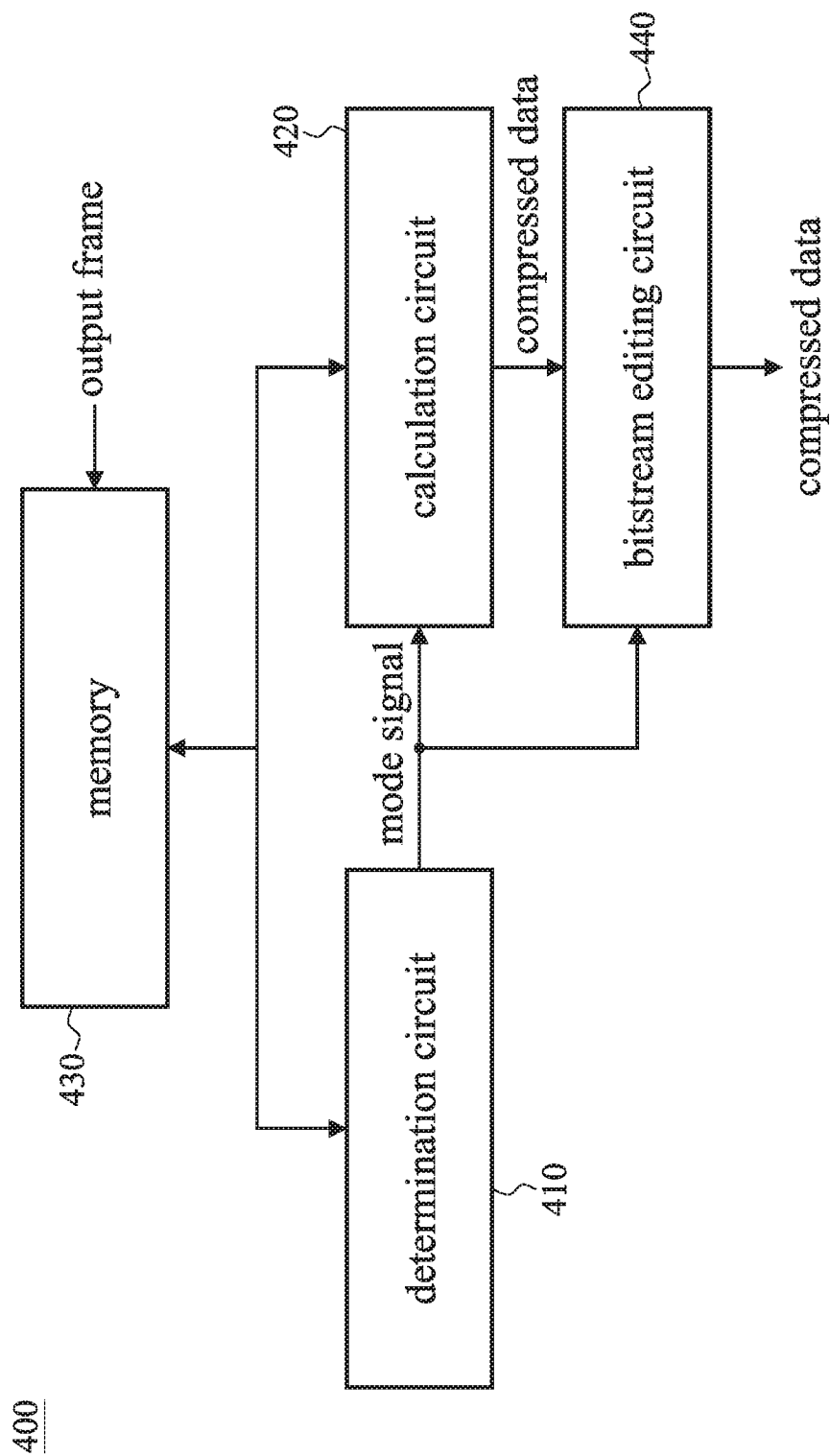
FIG. 4 illustrates a functional block diagram of a compressor according to another embodiment this disclosure.

FIG. 4 is a functional block diagram of the compressor 120 according to another embodiment of this disclosure. The compressor 400 includes a determination circuit 410, a calculation circuit 420, a memory 430 and a bitstream editing circuit 440. The memory 430 may be a line buffer which stores the data of multiple lines of the output frame, and the size of the memory 430 is associated with the size of the block (i.e., window) which the calculation circuit 420 uses in the compression operation. The flow of FIG. 3 also applies to the device of FIG. 4, and the details of steps S310 and S320 are omitted for brevity since they have been discussed in the foregoing embodiment. In this embodiment, when step S320 is negative, the determination circuit 410 calculates the color channel average value of the image data of a current block and uses the color channel average value as the characteristic value of the current block (step S330). In other words, the determination circuit 410 calculates a characteristic value for each block. Then, the determination circuit 410 determines whether the characteristic value meets a predetermined condition (step S350) and informs the calculation circuit 420 of the result (i.e., whether the predetermined condition is met or not) through the mode signal. In this embodiment, the compressor 400 decides an appropriate encoding mode for each block. In other words, it is probable that, in some embodiments, not all blocks of the same frame are encoded by means of the same encoding mode. The bitstream editing circuit 440 adjusts the data sequence of the compressed data (i.e., the data generated after the YUV-channel FLC-based encoding or the Y-channel FLC-based encoding) such that the decompressor 130 can correctly determine the encoding mode when decoding.

The following example illustrates how the calculation circuit 220 (or the calculation circuit 420) and the bitstream editing circuit 240 (or the bitstream editing circuit 440) execute step S360 or S370 by assuming that each block contains 4×4 pixels and that each channel is represented by 8 bits. For more details about FLC-based encoding, reference can be made to the US Patent Publication No. US20180167624A1.

As to step S360, it is assumed that the two reference points for the YUV-channel FLC-based encoding can be respectively represented by the data (Y1, U1, V1) and the data (Y2, U2, V2) (each data containing values for Y, U and V channels, respectively) and have a total data amount of 2×3×8=48 bits ("2" being the two reference points, "3" being the three channels and "8" being eight bits for each channel). The bitstream editing circuit 240 (or bitstream editing circuit 440) puts the value corresponding to the smaller Y channel value in the front when editing the bitstream. In other words, the bitstream editing circuit 240 (or the bitstream editing circuit 440) compares the values of Y1 and Y2 and then arranges the data accordingly. If, for example, Y1 is smaller than Y2, the bitstream is: Y1Y2U1U2V1V2 plus the index table (the total number of bits is 48+16×3=96 bits, "16" being 4×4 pixels in one block, and "3" being the number of bits of the index value for each pixel). If, on the other hand, Y2 is smaller than Y1, the bitstream is: Y2Y1U2U1V2V1 plus the index table (the total number of bits is 48+48=96 bits).

As to step S370, the calculation circuit 220 (or the calculation circuit 420) divides a block of 4×4 pixels into four subblocks: subblock a, b, c and d (each subblock has 2×2 pixels) before encoding, and so each block has four sets of reference points: (Ya1, Ya2), (Yb1, Yb2), (Yc1, Yc2) and (Yd1, Yd2), and the number of bits for each set is 2×8=16 bits ("2" being the two reference points and "8" being the number of bits for the Y channel). If Ya1 is greater than Ya2, the bitstream editing circuit 240 (or the bitstream editing circuit 440) places Ya1 at the front, Yb, Yc, and Yd follow the same rule. Here is an example: if Ya1>Ya2, Yb1>Yb2, Yc1>Yc2 and Yd1>Yd2, the bitstream is Ya1Ya2Yb1Yb2Yc1Yc2Yd1Yd2 plus the index table, and the total number of bits is 64+16×2=96 bits ("16" being 4×4 pixels in one block, and "2" being the number of bits of the index value for each pixel).

As discussed above, the bitstream editing circuit 240 (or the bitstream editing circuit 440) refers to the mode signal (i.e., based on whether the characteristic value meets the condition) to determine the position in the bitstream of the luminance component of the reference pixel. For the above-mentioned blocks or subblocks, the two reference points may be the two pixels having the maximum and minimum Y values, respectively, in each block or subblock.

It should be noted that when the calculation circuit 220 (or the calculation circuit 420) finds in step S360 that the two reference points have the same Y value (i.e., Y1=Y2), the calculation circuit 220 (or the calculation circuit 420) performs FLC-based encoding on the Y channel instead (step S370).

The decoding operation of the decompressor 130 in the first embodiment is different from that in the second embodiment. In the first embodiment, the decompressor 130 decides to conduct the YUV-channel FLC-based decoding or the Y-channel FLC-based decoding by referring to the global characteristic value GCV. In the second embodiment, the decompressor 130 retrieves the highest 16 bits from the bitstream (i.e., the compressed data) and then compares the first 8 bits (the first value) and the last 8 bits (the second value) of the 16 bits. The first value being less than the second value implies that the block having been subjected to the YUV-channel FLC-based encoding, while the first value being greater than or equal to the second value implies that the block having been subjected to the Y-channel FLC-based encoding. The decompressor 130 performs corresponding decoding operations according to different encoding modes.

This disclosure reduces compression-induced distortions by employing different encoding modes for different image contents. In this disclosure, because the amount of compressed data generated after encoding is the same for both the YUV-channel FLC-based encoding and the Y-channel FLC-based encoding (for example, the compressed data is 96 bits for both modes in cases where the block size is 4×4 pixels, and each channel is represented by 8 bits), the two encoding modes provided in this disclosure can share the memory. In other words, the two encoding modes of this disclosure can share the frame buffer 140; there is no need to provide an exclusive memory for each encoding mode. Therefore, this disclosure can achieve the best performance in image compression or even temporal noise reduction with the same hardware resource constraints (such as limited memory space and/or data transmission bandwidth).

This disclosure is not limited to the above two modes and may include FLC-based encoding performed on the U channel or V channel only, or FLC-based encoding performed on the U and V channels only (i.e., neglecting the Y channel).

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure. In addition, temporal noise reduction serves merely as an example, not a limitation, in the foregoing embodiments, and people having ordinary skill in the art can apply this disclosure to various types of image processing techniques based on the foregoing descriptions.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. An image compression method for compressing an image data of a frame to be compressed based on fixed-length code (FLC) to generate a compressed data, the method comprising:
   determining whether a characteristic value of the image data meets a condition;
   encoding only a luminance component of the image data to generate the compressed data when the characteristic value meets the condition;
   encoding the luminance component and a chrominance component of the image data to generate the compressed data when the characteristic value does not meet the condition; and
   storing the compressed data.

2. The image compression method of claim 1, wherein the characteristic value is a noise level of the image data, and the condition is that the noise level is less than a predetermined value.

3. The image compression method of claim 2, wherein the image data corresponds to one of a plurality of blocks of the frame to be compressed, and the blocks have the same characteristic value.

4. The image compression method of claim 1, wherein the characteristic value is an image property of the image data, and the condition is that the image property is a single-channel image.

5. The image compression method of claim 4, wherein the image data corresponds to one of a plurality of blocks of the frame to be compressed, and the blocks have the same characteristic value.

6. The image compression method of claim 1, wherein the characteristic value is a color saturation of the image data, and the condition is that the color saturation is less than a predetermined value.

7. The image compression method of claim 6, wherein the image data corresponds to one of a plurality of blocks of the frame to be compressed, and the blocks have their respective characteristic values.

8. The image compression method of claim 1, wherein a first compressed data is generated after only the luminance component of the image data is encoded, a second compressed data is generated after the luminance component and the chrominance component of the image data are encoded, and a data amount of the first compressed data is equal to a data amount of the second compressed data.

9. The image compression method of claim 1, further comprising:
   retrieving the image data from the frame to be compressed;
   determining whether a global characteristic value of the frame to be compressed is known;
   using the global characteristic value as the characteristic value of the image data when the global characteristic value is known; and
   calculating a color channel average value of the image data and using the color channel average value as the characteristic value of the image data when the global characteristic value is not known.

10. An image compressor for compressing an image data of a frame to be compressed based on fixed-length code (FLC) to generate a compressed data, comprising:
    a memory for storing the image data;
    a determination circuit configured to determine whether a characteristic value of the image data meets a condition; and
    a calculation circuit coupled to the memory and the determination circuit and configured to perform following steps:
      encoding only a luminance component of the image data to generate the compressed data when the characteristic value meets the condition; and
      encoding the luminance component and a chrominance component of the image data to generate the compressed data when the characteristic value does not meet the condition.

11. The image compressor of claim 10, wherein the characteristic value is a noise level of the image data, and the condition is that the noise level is less than a predetermined value.

12. The image compressor of claim 11, wherein the image data corresponds to one of a plurality of blocks of the frame to be compressed, and the blocks have the same characteristic value.

13. The image compressor of claim 10, wherein the characteristic value is an image property of the image data, and the condition is that the image property is a single-channel image.

14. The image compressor of claim 13, wherein the image data corresponds to one of a plurality of blocks of the frame to be compressed, and the blocks have the same characteristic value.

15. The image compressor of claim 10, wherein the characteristic value is a color saturation of the image data, and the condition is that the color saturation is less than a predetermined value.

16. The image compressor of claim 15, wherein the image data corresponds to one of a plurality of blocks of the frame to be compressed, and the blocks have their respective characteristic values.

17. The image compressor of claim 15, wherein the compressed data comprises the luminance component of a reference pixel, the compressed data is represented by a bitstream, and the image compressor further comprises:
    a bitstream editing circuit coupled to the determination circuit and the calculation circuit and configured to determine a position in the bitstream of the luminance component of the reference pixel according to whether the characteristic value meets the condition.

18. The image compressor of claim 10, wherein a first compressed data is generated after only the luminance component of the image data is encoded, a second compressed data is generated after the luminance component and the chrominance component of the image data are encoded, and a data amount of the first compressed data is equal to a data amount of the second compressed data.

19. The image compressor of claim 10, wherein the image data corresponds to one of a plurality of blocks of the frame to be compressed, and the determination circuit further performs following steps:
- determining whether a global characteristic value of the frame to be compressed is known;
- using the global characteristic value as the characteristic value of the image data when the global characteristic value is known; and
- calculating a color channel average value of the image data and using the color channel average value as the characteristic value of the image data when the global characteristic value is not known.

\* \* \* \* \*